(12) United States Patent
Abidin et al.

(10) Patent No.: US 6,888,415 B2
(45) Date of Patent: May 3, 2005

(54) RING OSCILLATOR DEVICES AND METHODS OF GENERATING SIGNALS

(75) Inventors: Cindra Widya Abidin, West Los Angeles, CA (US); Georgios S. Asmanis, North Hollywood, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/305,749

(22) Filed: Nov. 26, 2002

(65) Prior Publication Data

US 2004/0100335 A1 May 27, 2004

(51) Int. Cl.[7] .............................................. H03B 27/00
(52) U.S. Cl. ........................ 331/57; 331/25; 327/156; 327/159
(58) Field of Search ..................... 331/57, 25; 327/156, 327/159

(56) References Cited

U.S. PATENT DOCUMENTS 5,821,823 A * 10/1998 Bereza ......................... 331/57
6,587,007 B2 * 7/2003 Exeter ......................... 331/57

* cited by examiner

*Primary Examiner*—Arnold Kinkead
(74) *Attorney, Agent, or Firm*—Glen B. Choi

(57) ABSTRACT

Techniques to tune a frequency of a sinusoidal signal using devices having controllable signal phase delay times. One implementation may include an input terminal to receive an input signal; a first delay path to selectively receive the input signal; a second delay path to selectively receive the input signal; and a control terminal to control an extent to which the input signal flows through the first delay path and the second delay path.

27 Claims, 5 Drawing Sheets

RING OSCILLATOR DEVICES AND METHODS OF GENERATING SIGNALS

FIELD

The subject matter disclosed herein generally relates to oscillator devices.

DESCRIPTION OF RELATED ART

A voltage controlled oscillator (VCO) may be used to generate a sinusoidal voltage signal. For example, VCOs may be used in communication systems to transmit and reproduce signals. FIG. 1 depicts a prior art ring oscillator implementation of a VCO 100 having multiple similar ring elements 110-A to 110-C. FIG. 2 depicts a prior art implementation of a ring element 110 (ring elements 110-A to 110-C are similar to ring element 110). Ring element 110 is a differential transistor pair element that uses a capacitive load 202 and resistive load 204. To change the frequency of the sinusoidal voltage signal output by the VCO 100 (shown as Vout), the capacitance of each capacitor 202 in each ring element 110 may need to be changed. Frequency variation may be limited due to the difficulty in varying a capacitor value. In addition, the phase noise performance of VCO 100 may suffer due to thermal noise from the resistive load 204. The phase noise performance measures the purity of frequency content output by an oscillator.

DESCRIPTION OF THE DRAWINGS

Note that use of the same reference numbers in different figures indicates the same or like elements.

DETAILED DESCRIPTION

Figure 3:
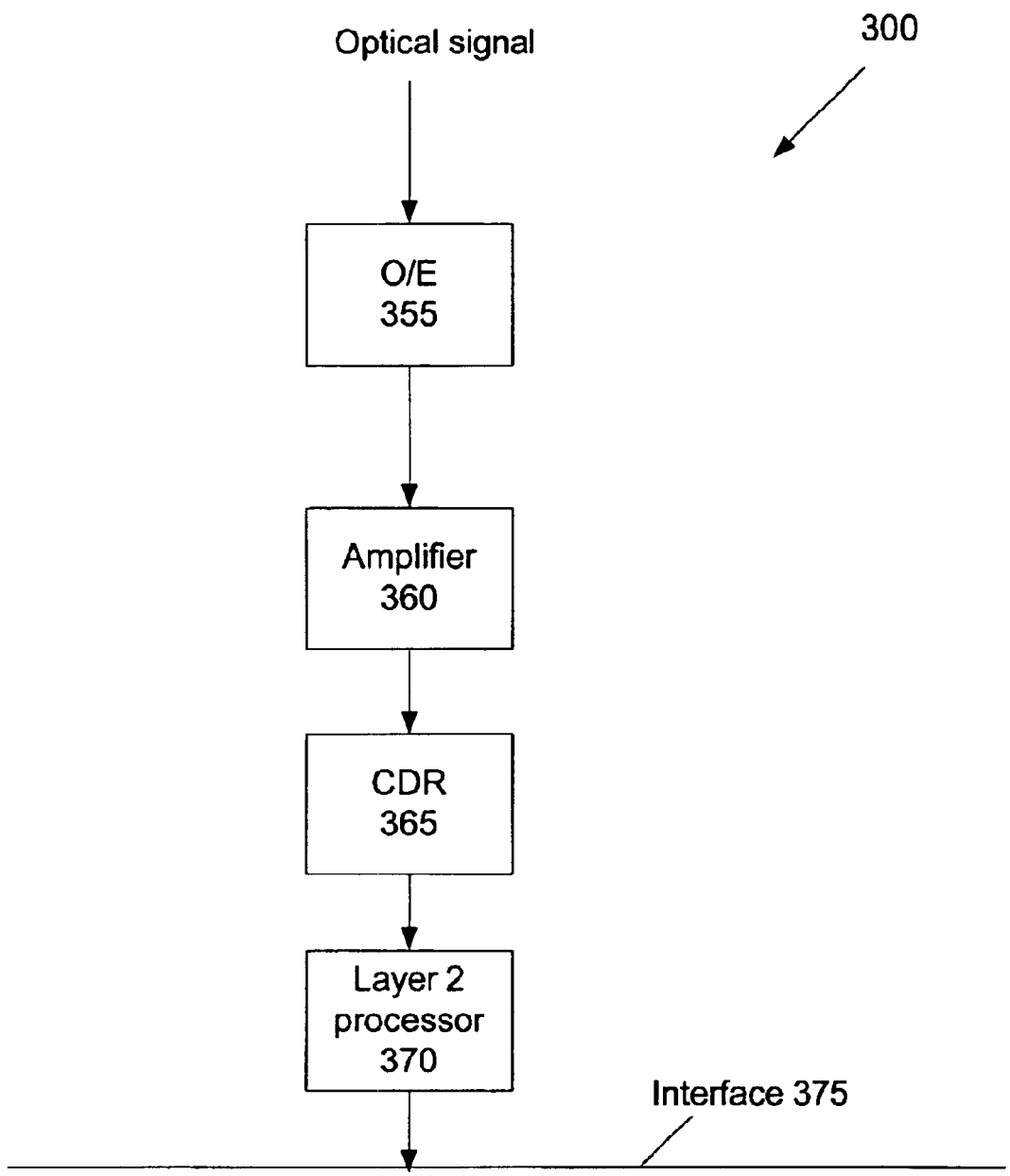
FIG. 3 depicts one possible receiver system in which some embodiments of the present invention may be used.

FIG. 3 depicts one possible receiver system 300 in which some embodiments of the present invention may be used. Receiver 300 may receive signals encoded in compliance for example with optical transport network (OTN), Synchronous Optical Network (SONET), and/or Synchronous Digital Hierarchy (SDH) standards. Example optical networking standards may be described in ITU-T Recommendation G.709 Interfaces for the optical transport network (OTN) (2001); ANSI T1.105, Synchronous Optical Network (SONET) Basic Description Including Multiplex Structures, Rates, and Formats; Bellcore Generic Requirements, GR-253-CORE, Synchronous Optical Network (SONET) Transport Systems: Common Generic Criteria (A Module of TSGR, FR-440), Issue 1, Dec. 1994; ITU Recommendation G.872, Architecture of Optical Transport Networks, 1999; ITU Recommendation G.825, "Control of Jitter and Wander within Digital Networks Based on SDH" March, 1993; ITU Recommendation G.957, "Optical Interfaces for Equipment and Systems Relating to SDH", July, 1995; ITU Recommendation G.958, Digital Line Systems based on SDH for use on Optical Fibre Cables, November, 1994; and/or ITU-T Recommendation G.707, Network Node Interface for the Synchronous Digital Hierarchy (SDH) (1996).

Referring to FIG. 3, optical-to-electrical converter ("O/E") 355 may convert optical signals received from an optical network from optical format to electrical format. Although reference has been made to optical signals, the receiver 300 may, in addition or alternatively, receive electrical signals from an electrical signal network or wireless or wire-line signals according to any standards. Amplifier 360 may amplify the electrical signals. Clock and data recovery unit ("CDR") 365 may generate cleaner versions of the electrical signals and corresponding clock. For example, CDR 365 may use a VCO in a phase locked loop ("PLL") to regenerate sinusoidal electrical signals. On the regenerated signals, layer two processor 370 may perform media access control (MAC) management in compliance for example with Ethernet, described for example in versions of IEEE 802.3; optical transport network (OTN) de-framing and de-wrapping in compliance for example with ITU-T G.709; forward error correction (FEC) processing, in accordance with ITU-T G.975; and/or other layer 2 processing. Some implementations of receiver system 300 may utilize 10 Gigabit Attachment Unit Interface (XAUI), Serial Peripheral Interface (SPI), ten bit interface (TBI), and/or Gigabit Media Independent Interface (GMII) compliant interfaces (as well as interfaces based on related standards) to provide intercommunication between the layer two processor 370 and the CDR 365.

Interface 375 may provide intercommunication between layer two processor 370 and other devices such as a microprocessor, memory devices (not depicted), packet processor (not depicted), and/or a switch fabric (not depicted). Interface 375 may provide intercommunication in compliance, for example, with Peripheral Component Interconnect (PCI), Universal Serial Bus (USB), Ethernet, IEEE 1394, and/or a vendor specific multi-source agreement (MSA) protocol.

Figure 1:
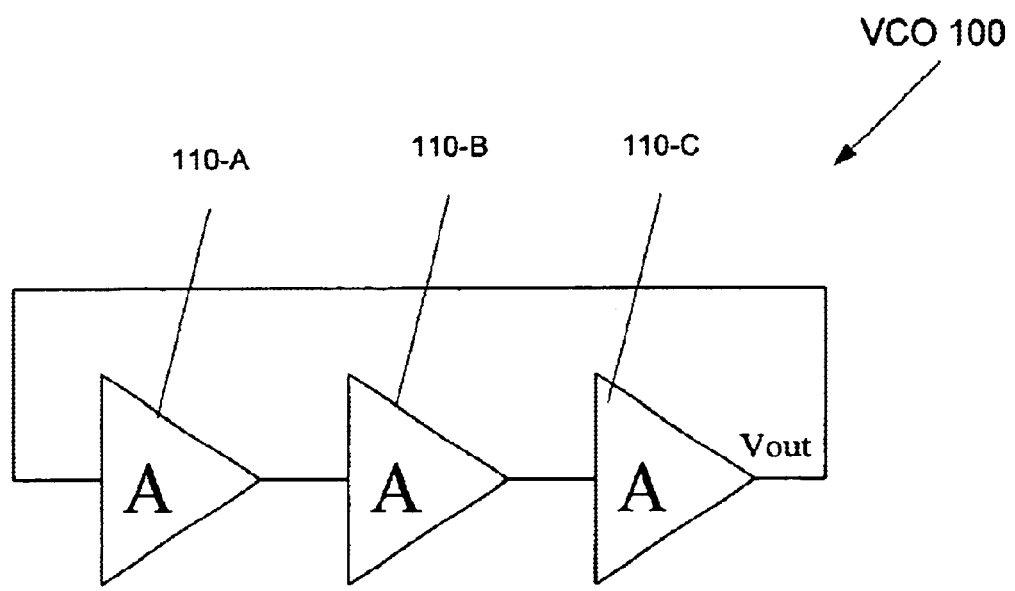
FIG. 1 depicts a well known ring oscillator implementation of a VCO having multiple similar ring elements
Figure 4:
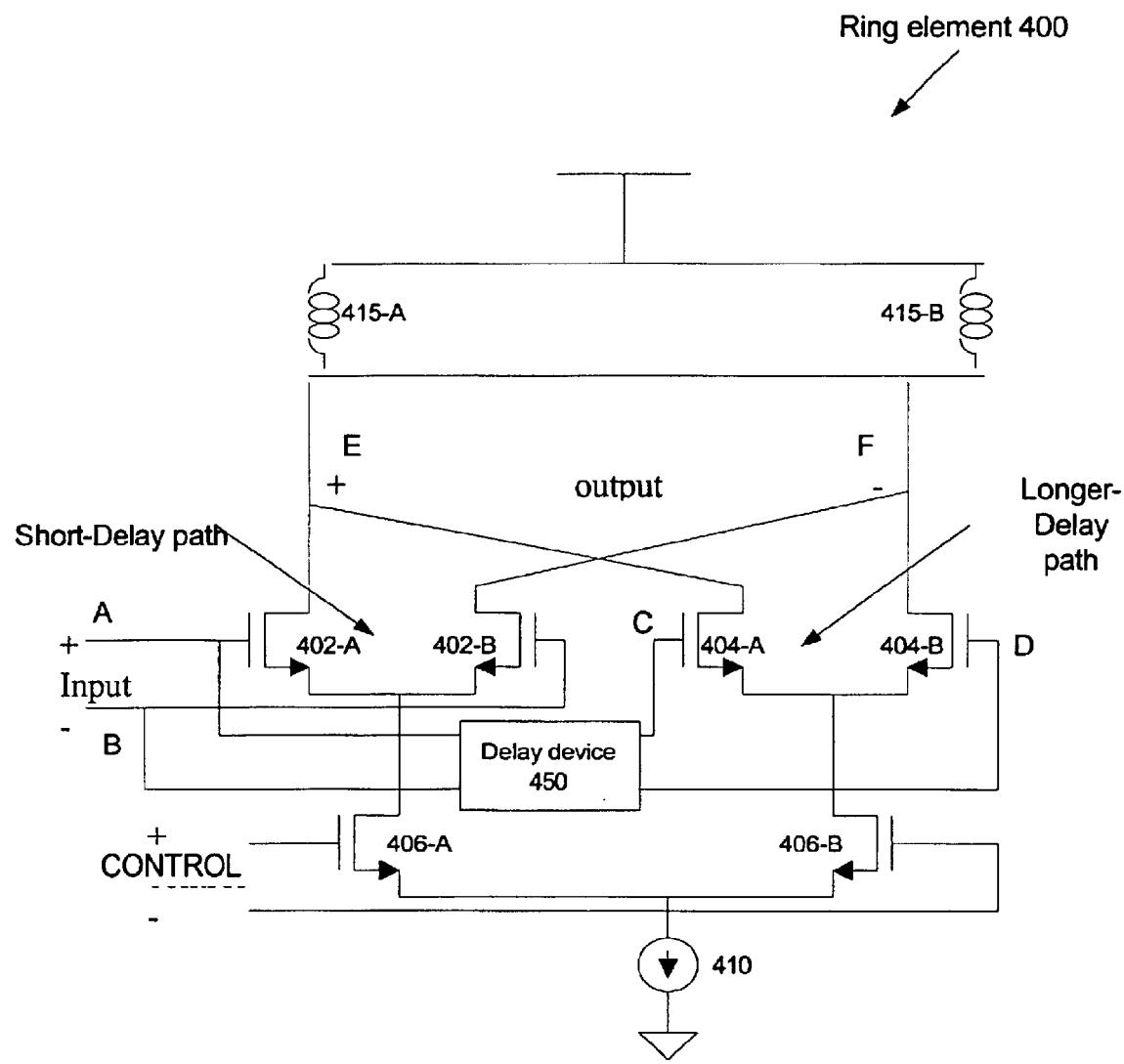
FIG. 4 depicts one example implementation of a ring element, in accordance with an embodiment of the present invention.

In accordance with an embodiment of the present invention, FIG. 4 depicts one example implementation of a ring element 400. Ring element 400 may be used in a ring formation such as in an arrangement similar to the ring elements 110-A to 110-C of VCO 100 depicted in FIG. 1. When used in a ring formation, output terminals E and F of a ring element 400 may be coupled to input terminals A and B of another ring element similar to ring element 400. When used in a ring formation, each of the ring elements 400 may utilize the same control signal at terminal CONTROL.

In accordance with an embodiment of the present invention, terminal OUTPUT (nodes E and F) of ring element 400 may provide a phase delayed version of the signal provided to terminal INPUT (nodes A and B) and the delay may be tuned by the control signal provided at terminal CONTROL. In accordance with an embodiment of the present invention, a control signal provided at terminal CONTROL may tune the frequency of a signal by a ring oscillator utilizing multiple ring elements 400 by adjusting the phase delay between the input and output terminals of an individual ring element.

One implementation of ring element 400 may include input transistors 402-A, 402-B, 404-A, and 404-B, control transistors 406-A and 406-B, load 415-A, load 415-B, current source 410, and delay device 450. Input transistors 402-A, 402-B, 404-A, and 404-B as well as control transistors 406-A and 406-B may be implemented as MOSFET transistors although various other types of transistors may be used, such as BJT and HBT types. Input transistors 402-A, 402-B, 404-A, and 404-B may have similar gain/phase characteristics.

Figure 2:
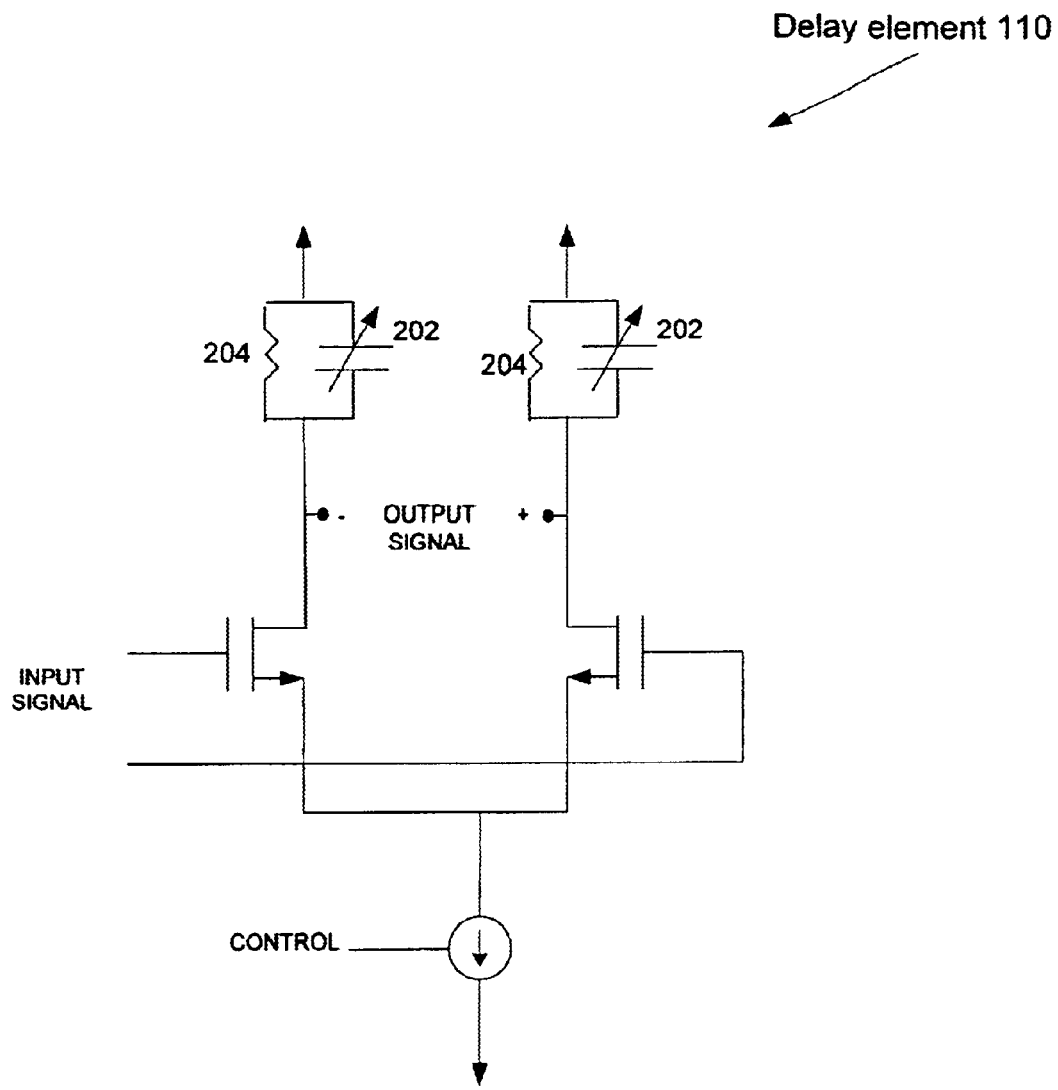
FIG. 2 depicts a prior art implementation of a ring element.

Load 415-A and load 415-B may be implemented as inductors. Use of inductor loads in ring element 400 may provide better phase noise performance than use of resistive loads (e.g., as used in the ring element 110 of FIG. 2). Moreover, the use of inductor loads may also allow operation at higher frequencies than operation provided by ring element 100. Inductor values may be chosen to provide a maximum allowable inductance for a desired maximum frequency of operation. A high "Q value" inductor may be used to improve the phase noise of the oscillator although it is not required.

In one implementation, a control signal applied to gate terminals of control transistors 406-A and 406-B may control an amount of phase delay that a signal input to terminal INPUT is delayed before being provided at terminal OUTPUT. For example, a high value of a control signal may control current of current source 410 to flow primarily through the short-delay path (e.g., transistors 402-A and 402-B). For a high value of a control signal, an input signal to terminal INPUT may experience a time delay due to a signal path through transistors 402-A and 402-B and loads 415-A and 415-B prior to being provided to terminal OUTPUT.

Conversely, a low value of the control signal may control current of current source 410 to flow primarily through the longer-delay path which includes delay device 450 and transistors 404-A and 404-B. For a low value of a control signal, an input signal to terminal INPUT may experience a phase delay from a signal path through delay device 450 combined with transistors 404-A and 404-B as well as load 415-A and 415-B prior to being provided to terminal OUTPUT.

When the control signal is between high and low, control current of current source 410 may flow evenly through the short-delay and longer-delay paths. When the control signal is between high and low, an input signal to terminal INPUT may experience a phase delay, prior to being provided to terminal OUTPUT, from a signal path partially through (a) transistors 402-A and 402-B and load 415-A and 415-B and (b) delay device 450 combined transistors 404-A and 404-B as well as load 415-A and 415-B. The phase delay of an input signal in this scenario may be between those for low and high values of the control signal.

Figure 5:
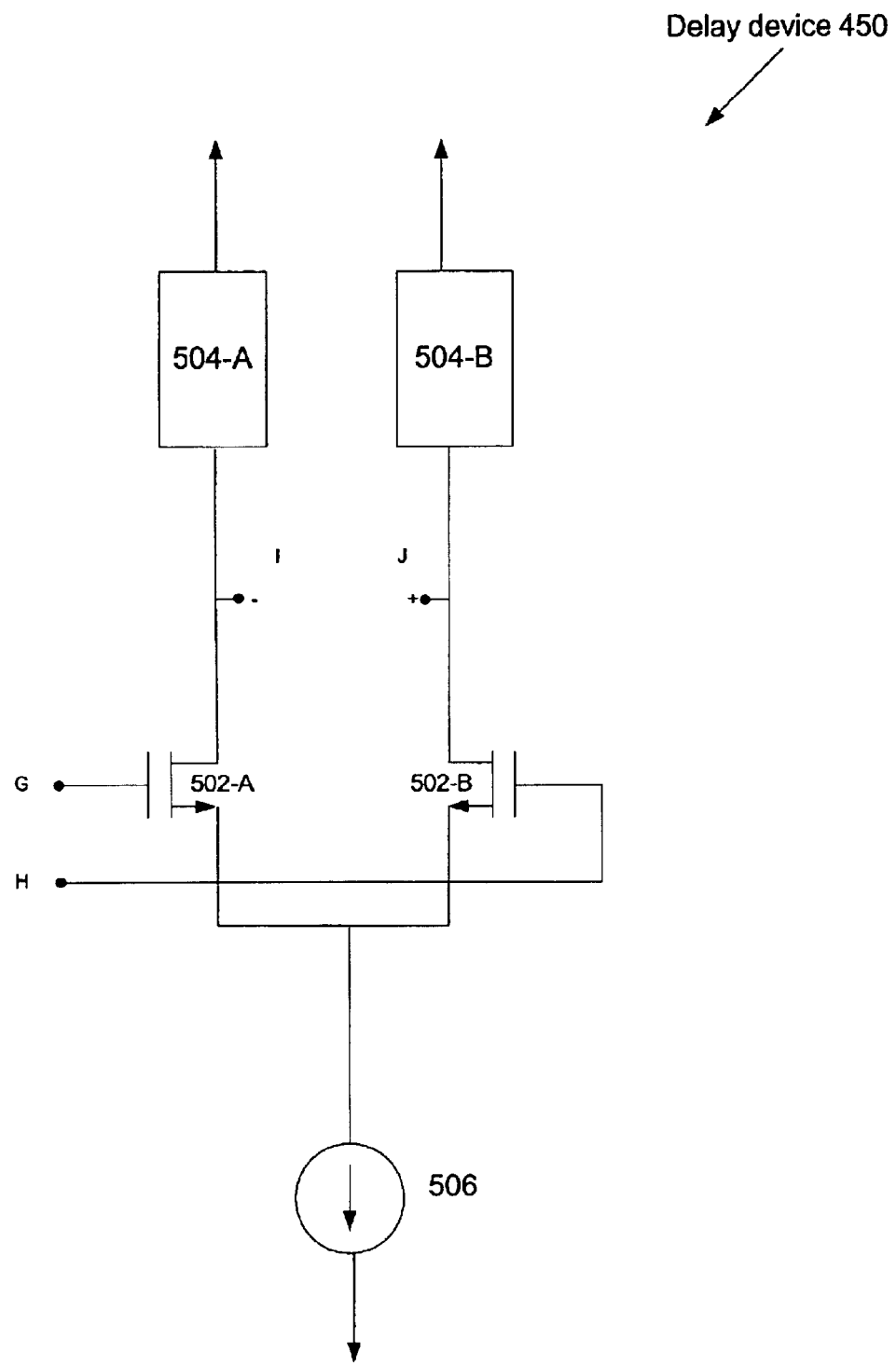
FIG. 5 depicts one suitable implementation of a delay device, in accordance with an embodiment of the present invention.

FIG. 5 depicts one suitable implementation of delay device 450. In accordance with an embodiment of the present invention, delay device 450 may delay signals provided at input terminals (terminal INPUT) of ring element 400. One implementation of delay device 450 may include transistors 502-A and 502-B, load 504-A, load 504-B, and current source 506. This implementation is merely illustrative and other devices can be used to provide a delayed signal path. For example, other combinations of circuit elements can be used to provide a delayed signal path.

Transistors 502-A and 502-B may be implemented as MOSFET transistors although various other types of transistors may be used, such as BJT and HBT types. Gate terminals of transistors 502-A and 502-B (shown as respective terminals G and H) may be coupled to receive an input signal from respective terminals A and B of ring element 400. Load 504-A may couple a high supply voltage to a drain terminal of transistor 502-A whereas load 504-B may couple a high supply voltage to a drain terminal of transistor 502-B. Loads 504-A and 504-B may be implemented as impedance elements such as resistive elements. Drain terminals of transistors 502-A and 502-B may provide respective terminals I and J. Source terminals of transistors 502-A and 502-B may be coupled to current source 506.

In one implementation, terminals G and H of delay device 450 may be coupled to respective terminals A and B of ring element 400. In one implementation, terminals I and J of delay device 450 may be coupled to respective terminals C and D of ring element 400.

When ring element 500 is used in a ring formation similar to that described with respect to FIG. 1A, the frequency of signal output by the ring (Vout) may be represented as follows:

Ring frequency=$1/(2T^{*}$number of ring elements 500), where

T=total delay through a ring element 500

In one implementation, $T_{low}<T<T_{high}$, where $T_{low}$ may represent the lowest amount of phase delay a ring element 500 introduces (e.g., when the control signal is in a high state) and Thigh may the highest amount of phase delay a ring element 500 introduces (e.g., when the control signal is in a low state). The minimum $T_{low}$ may be determined by a minimum phase delay through ring element 500. A maximum Thigh may be determined by a maximum delay that can be accomplished without deteriorating the VCO's center frequency.

Accordingly, one advantage of some embodiments of the present invention may be that when a ring element 500 is used in a VCO ring formation, the frequency of the signal provided by the VCO may be controlled using a control signal as opposed to manually adjusting capacitance values as in the prior art. A VCO tuning range, which is defined as the maximum frequency deviation the VCO can be tuned without significant degradation in its performance, can be maximized. Adjusting the frequency of oscillation in this method may increase the linearity of gain variation.

Modifications

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. An apparatus comprising:
   a clock and data recovery device to provide a version of a first signal re-timed based on a clock signal, wherein the clock and data recovery device includes a clock source to provide the clock signal, wherein the clock source includes:
      an input terminal to receive an input signal;
      a first delay path to selectively receive the input signal;
      a second delay path to selectively receive the input signal, wherein the second delay path includes:
         a delay device to delay the input signal, wherein the delay device includes an amplifier to amplify the input signal; and
      a control terminal to control an extent to which the input signal flows through the first delay path and the second delay path.

2. The apparatus of claim 1, wherein the first delay path comprises:
   a differential pair of transistor devices to receive the input signal; and first and second loads coupled to the differential pair and to control the gain and phase responses of the differential pair.

3. The apparatus of claim 2, wherein the first load comprises an inductor and wherein the second load comprises an inductor.

4. The apparatus of claim 1, wherein the second delay path further comprises:
a differential pair of transistor devices to receive a delayed input signal from the delay device; and
first and second loads coupled to the differential pair and to control the gain of the differential pair of transistors.

5. The apparatus of claim 4, wherein the first load comprises an inductor and wherein the second load comprises an inductor.

6. The apparatus of claim 1, wherein
the second delay path delays the input signal more than the delay of the first delay path.

7. An apparatus comprising:
a clock and data recovery device to provide a version of a first signal re-timed based on a clock signal, wherein the clock and data recovery device includes a clock signal source, wherein the clock signal source includes:
at least three inter-coupled ring elements to output the clock signal, wherein each ring element comprises:
an input terminal to receive an input signal;
a first delay path to selectively receive and delay the input signal;
a second delay path to selectively receive the input signal, wherein the second delay path comprises:
a delay device to delay the input signal, wherein the delay device comprises an amplifier to amplify the input signal; and
a control terminal to control an extent to which the input signal flows through the first delay path and the second delay path.

8. The apparatus of claim 7, wherein:
the second delay path delays the input signal more than the first delay path.

9. The apparatus of claim 7, wherein a control signal applied to the control terminal controls a frequency of the clock signal.

10. The apparatus of claim 1, wherein the amplifier comprises:
a differential pair of transistor devices to receive the input signal; and
first and second loads coupled to the differential pair and to control the gain of the differential pair of transistors.

11. A system comprising:
a clock and data recovery system to provide a version of an input signal re-timed based on a clock signal, wherein the clock and data recovery system comprises at least two chain-coupled ring elements to output the clock signal and wherein each ring element comprises:
an input terminal to receive a feedback signal,
a first delay path to selectively receive the feedback signal,
a second delay path to selectively receive the feedback signal, wherein the second delay path includes a delay device to receive the feedback signal, wherein the delay device comprises an amplifier to amplify the feedback signal, and
a control terminal to control an extent to which the feedback signal flows through the first delay path and the second delay path;
a data processor to receive the re-timed version of the input signal from the clock and data recovery system; and
an interface to exchange signals with the data processor.

12. The system of claim 11, further comprising a memory device operatively responsive to the interface.

13. The system of claim 11, wherein the data processor is to perform optical transport network de-framing in compliance with ITU-T G.709.

14. The system of claim 11, wherein the data processor is to perform forward error correction processing in compliance with ITU-T G.975.

15. The system of claim 11, wherein the interface is compatible with USB.

16. The system of claim 11, wherein the interface is compatible with PCI.

17. The system of claim 11, wherein the interface is compatible with IEEE 1394.

18. The system of claim 11, further comprising a switch fabric operatively responsive to the interface.

19. The system of claim 11, further comprising a packet processor operatively responsive to the interface.

20. A method comprising:
generating a re-timed version of a source signal using a clock signal, wherein the clock signal is generated by:
directing an input signal among at least two paths based on a control signal, wherein the at least two paths include:
a first path and a second path and wherein the second path delays the input signal more than the first path and wherein the second path amplifies the input signal, and
providing an output signal based upon the delayed input signal; and
directing the output signal among at least two paths based on the control signal, wherein the at least two paths include:
a third path and a fourth path and wherein the fourth path delays the output signal more than the third path;
providing a second output signal based upon the delayed output signal; and
providing the clock signal based on the second output signal.

21. The method of claim 20, further comprising:
controlling a frequency of the second output signal based on the control signal.

22. An apparatus comprising:
an input terminal to receive an input signal;
a first delay path to selectively receive the input signal;
a second delay path to selectively receive the input signal, wherein the second delay path includes:
a delay device to delay the input signal, wherein the delay device includes an amplifier to amplify the input signal; and
a control terminal to control an extent to which the input signal flows through the first delay path and the second delay path.

23. The apparatus of claim 22, wherein the first delay path comprises:
a differential pair of transistor devices to receive the input signal; and
first and second loads coupled to the differential pair and to control the gain and phase responses of the differential pair of transistors.

24. The apparatus of claim 23, wherein the first load comprises an inductor and wherein the second load comprises an inductor.

25. The apparatus of claim 22, wherein the second delay path further comprises:

a differential pair of transistor devices to receive a delayed input signal from the delay device; and first and second loads coupled to the differential pair and to control the gain of the differential pair of transistors.

26. The apparatus of claim 25, wherein the first load comprises an inductor and wherein the second load comprises an inductor.

27. The apparatus of claim 22, wherein
the second delay path delays the input signal more than the delay of the first delay path.

* * * * *